United States Patent
Kim et al.

(10) Patent No.: US 7,566,910 B2
(45) Date of Patent: Jul. 28, 2009

(54) GAN-BASED COMPOUND SEMICONDUCTOR LIGHT EMITTING DEVICE

(75) Inventors: Hyun-soo Kim, Yongin-si (KR); Jae-hee Cho, Yongin-si (KR)

(73) Assignee: Samsung Electro-Mechanics Co., Ltd., Suwon-Si, Gyeonggi-Do (KR)

( * ) Notice: Subject to any disclaimer, the term of this patent is extended or adjusted under 35 U.S.C. 154(b) by 323 days.

(21) Appl. No.: 11/220,581

(22) Filed: Sep. 8, 2005

(65) Prior Publication Data

US 2006/0108593 A1  May 25, 2006

(30) Foreign Application Priority Data

Nov. 23, 2004  (KR) ............... 10-2004-0096149

(51) Int. Cl.
*H01L 33/00* (2006.01)
(52) U.S. Cl. .............. 257/98; 257/95; 257/97; 257/E33.005; 257/E33.068
(58) Field of Classification Search ............ 257/97, 257/98
See application file for complete search history.

(56) References Cited

U.S. PATENT DOCUMENTS 6,630,689 B2   10/2003  Bhat et al.
6,946,309 B2 *  9/2005  Camras et al. ............. 438/26
2003/0209714 A1 * 11/2003  Taskar et al. ............. 257/79

FOREIGN PATENT DOCUMENTS

JP         2000-031540        1/2000

OTHER PUBLICATIONS

T. Gessmann et al., "Omnidirectional Reflective Contacts for Light-Emitting Diodes," IEEE Electron Device Letters, Oct. 2003, vol. 24, No. 10, pp. 683-685.
Korean Office Action Application No. 10-2004-0069149 dated Apr. 21, 2008 (with English Language Translation).

* cited by examiner

*Primary Examiner*—Jerome Jackson, Jr.
(74) *Attorney, Agent, or Firm*—Buchanan Ingersoll & Rooney PC

(57) ABSTRACT

A GaN-based compound semiconductor light emitting device is provided. The semiconductor light emitting device includes a substrate; an n-type semiconductor layer formed on the substrate; an active layer formed on a first region of the n-type semiconductor layer; a p-type semiconductor layer formed on the active layer; a p-type electrode formed on the p-type semiconductor layer; an n-type electrode formed on a second region separated from the first region of the n-type semiconductor layer; a dielectric layer formed on a sidewall of a stack comprising the p-type semiconductor layer, the active layer, and the n-type semiconductor layer; and a reflective layer formed on the dielectric layer.

14 Claims, 3 Drawing Sheets

GAN-BASED COMPOUND SEMICONDUCTOR LIGHT EMITTING DEVICE

CROSS-REFERENCE TO RELATED PATENT APPLICATIONS

This application claims the benefit of Korean Patent Application No. 10-2004-0096149, filed on Nov. 23, 2004, in the Korean Intellectual Property Office, the disclosure of which is incorporated herein in its entirety by reference.

BACKGROUND OF THE DISCLOSURE

1. Field of the Disclosure

The disclosure relates to a GaN-based group III-V compound semiconductor light emitting device, and more particularly, to a flip-chip semiconductor light emitting device in which a highly-reflective layer is formed on a sidewall of a GaN layer including an active layer.

2. Description of the Related Art

A semiconductor light emitting diode (LED) is widely used in fields of communication such as optical communication or in a device such as a compact disc player (CDP) or in a digital versatile disc player (DVDP), as a means for transmitting data or writing and reading data. A semiconductor LED has a wider application such as a large-sized outdoor electric sign or a backlight for an LCD.

An LED using a GaN-based compound semiconductor is small and has low power consumption. In particular, a GaN-based compound semiconductor has a high light-emitting strength and a high brightness, and thus is used in outdoor displays.

When an active region of a flip-chip LED using a GaN-based compound semiconductor is 300×300 μm², the LED is generally driven at an input power of 0.06 W. However, when the LED is installed for illumination, the LED should be driven at an input power of 10 W. To this end, it is essential to design a large-sized chip having an active region of 3000× 3000 μm². It is important in such a large-sized chip to reduce the loss of light that is emitted to the outside through a sidewall of a GaN layer.

U.S. Pat. No. 6,630,689 discloses a technique in which a plurality of dielectric stacks are stacked on a mesa wall, and a highly-reflective coating layer is formed, thereby improving efficiency for extracting light from a light emitting diode (LED).

SUMMARY OF THE DISCLOSURE

The present invention may provide a semiconductor light emitting device which prevents light emitted from an active layer from being emitted through a sidewall of a GaN layer including an active layer.

The present invention also may provide a semiconductor light emitting device which provides for the improved extraction of light from an active layer in a flip-chip semiconductor light emitting device.

According to an aspect of the present invention, there is provided a semiconductor light emitting device, the semiconductor light emitting device including: a substrate; an n-type semiconductor layer formed on the substrate; an active layer formed on a first region of the n-type semiconductor layer; a p-type semiconductor layer formed on the active layer; a p-type electrode formed on the p-type semiconductor layer; an n-type electrode formed on a second region separated from the first region of the n-type semiconductor layer; a dielectric layer formed on a sidewall of a stack comprising the p-type semiconductor layer, the active layer, and the n-type semiconductor layer; and a reflective layer formed on the dielectric layer.

The refractive index of the dielectric layer may be approximately 1 to 2.5.

The thickness of the dielectric layer may be approximately ¼ of the wavelength of light emitted from the active layer.

The substrate may be formed of a transparent material, preferably, sapphire.

The dielectric layer may be formed of a material selected from the group consisting of silicon oxide, silicon nitride, silicon oxynitride, aluminum oxide, lithium fluoride, and calcium fluoride.

The reflective layer may be formed of a material selected from the group consisting of Ag, Al, Au, Pt, Ru, and Ir.

The n-type semiconductor layer, the active layer, and the p-type semiconductor layer may be GaN-based group III-V nitride compounds.

BRIEF DESCRIPTION OF THE DRAWINGS

The above and other aspects of the present invention will become further apparent by describing in detail exemplary embodiments thereof with reference to the attached drawings in which.

DETAILED DESCRIPTION OF EXEMPLARY EMBODIMENTS

Figure 1:
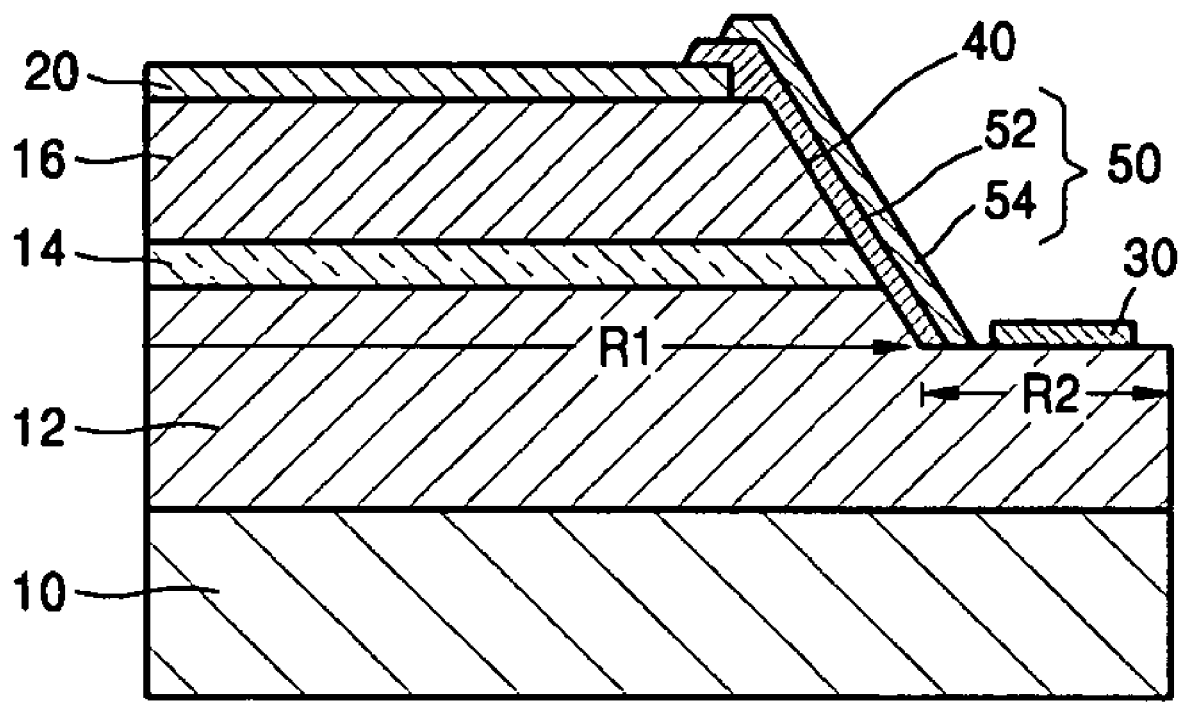
FIG. 1 is a schematic cross-sectional view of a GaN-based group III-V semiconductor light emitting diode (LED) according to an embodiment of the present invention.

The present invention will now be described with reference to the accompanying drawings, in which exemplary embodiments of the invention are shown. In the drawings, the thicknesses of layers and regions are exaggerated for clarity.

FIG. 1 is a schematic cross-sectional view of a GaN-based group III-V semiconductor light emitting diode (LED) according to an embodiment of the present invention. Referring to FIG. 1, the LED according to the present invention includes a first compound semiconductor layer 12 formed on a transparent substrate 10. The first compound semiconductor layer 12 may be an n-type group III-V compound semiconductor layer, for example, an n-GaN layer, or may be a different compound semiconductor layer. The first compound semiconductor layer 12 may include a first region R1 and a second region R2. An active layer 14 from which light, for example, blue light or ultraviolet ray is emitted by recombination of p-type and n-type carriers, is stacked on a first region R1. A second compound semiconductor layer 16 is stacked on the active layer 14. The second compound semiconductor layer 16 may be a p-type group III-V compound semiconductor layer, for example, a p-GaN layer, or may be a different compound semiconductor layer. An n-type electrode 30 is formed on the second region R2 on the first compound semiconductor layer 16.

A p-type electrode 20 is formed on the second compound semiconductor layer 16. The p-type electrode 20 may include silver (Ag) or silver alloy.

A sidewall 40 of a stack including the p-type GaN layer 16, the active layer 14, and the n-type GaN layer 12 forms a predetermined angle, for example, approximately 35 to 55 degrees, with respect to the substrate 10. A highly-reflective layer 50 is formed on the sidewall 40. The highly-reflective layer 50 includes a dielectric layer 52 formed on the sidewall 40 and a reflective layer 54 formed on the dielectric layer 52. The reflective layer 54 is formed as a metallic layer and may be connected to any one of the p-type electrode 20 and the n-type electrode 30 but does not connect the two electrodes 20 and 30 to each other.

The transparent substrate 10 may be formed of sapphire.

Figure 2A:
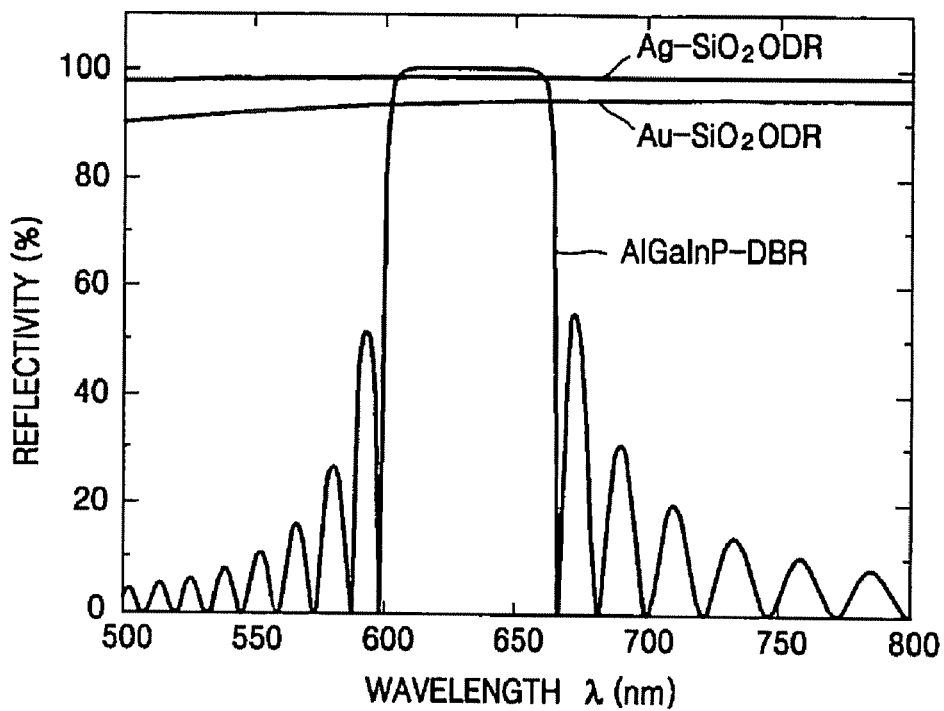
FIG. 2A is a graph of reflectivity of an omnidirectional reflective (ODR) contact and a distributed bragg reflector (DBR) contact according to a wavelength of light.
Figure 2B:
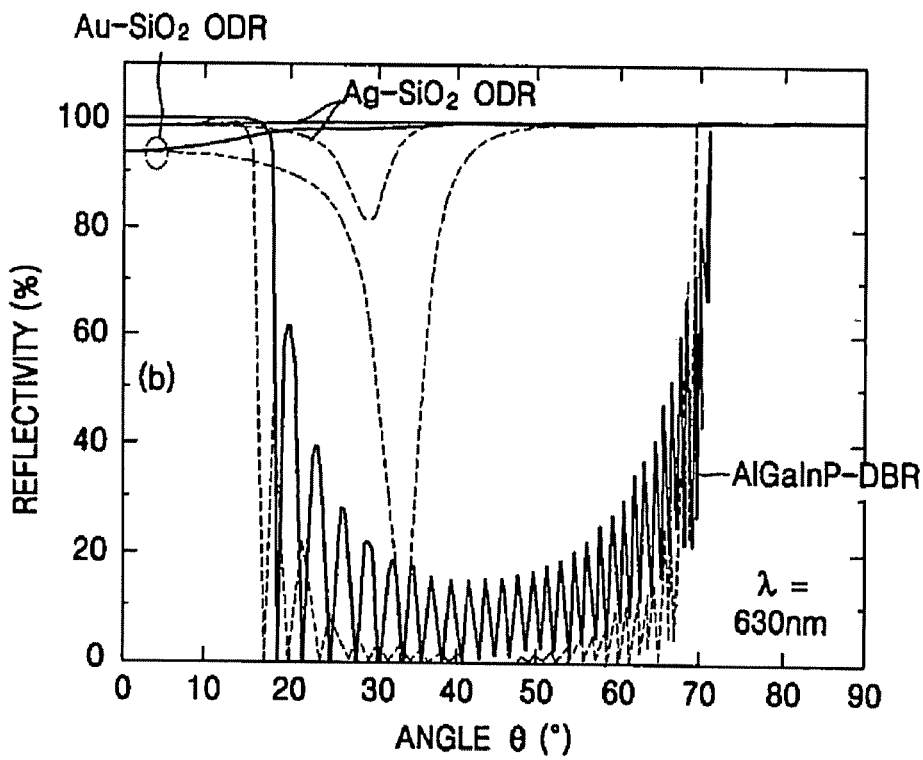
FIG. 2B is a graph of reflectivity of an omnidirectional reflective (ODR) contact and a distributed bragg reflector (DBR) contact according to an incident angle of light.

FIGS. 2A and 2B are graphs of reflectivity of an omnidirectional reflective (ODR) contact and a distributed bragg reflector (DBR) contact according to the wavelength and incident angle of light, respectively, which are disclosed in IEEE Electron device letters, Vol. 24, No. 10, October 2003. The ODR contact shows high reflectivity of more than 90% regardless of wavelength and angle. However, in the DBR contact such as a dielectric stack as disclosed in U.S. Pat. No. 6,630,689, the wavelength and angle limit high reflectivity. Considering this, when the ODR contact is coated on a sidewall of a light emitting diode (LED), the LED having high reflectivity can be implemented.

Figure 3:
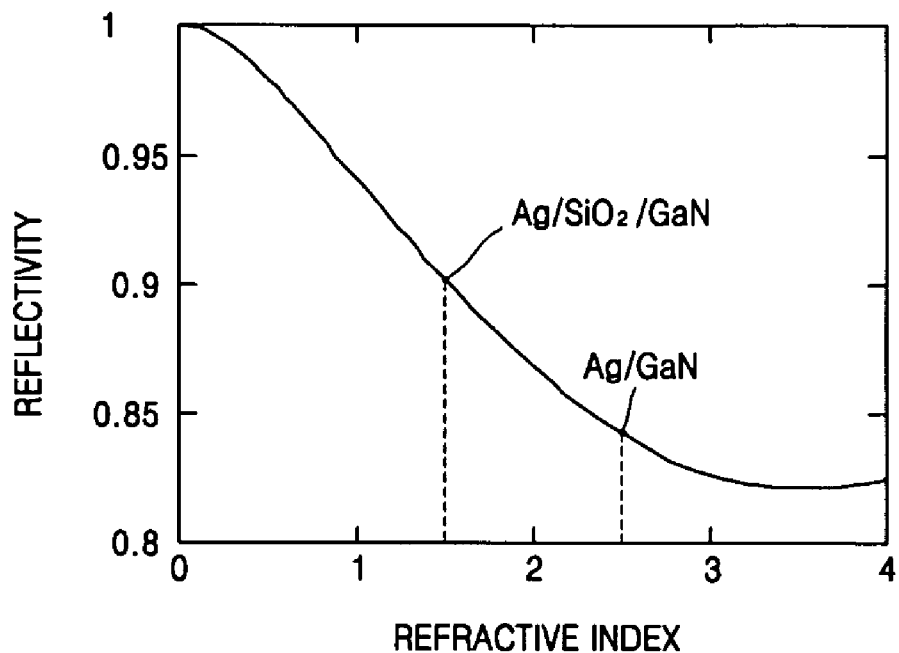
FIG. 3 is a graph of reflectivity according to a refractive index of a dielectric layer when the dielectric layer and silver are sequentially coated on the surface of a GaN layer.

FIG. 3 is a graph of reflectivity according to a refractive index of a dielectric layer when the dielectric layer and silver are sequentially coated on the surface of a GaN layer. Reflectivity is obtained using equation 1.

$$R = \frac{\{(n_s - n_d)(n_d + n_m) + (n_s + n_d)k_m\}^2 + \{(n_s - n_d)k_m^2 + (n_s + n_d)(n_d - n_m)\}^2}{\{(n_s + n_d)(n_d + n_m) + (n_s - n_d)k_m\}^2 + \{(n_s + n_d)k_m^2 + (n_s - n_d)(n_d - n_m)\}^2} \quad (1)$$

In equation 1, $n_s$ is 2.5 which is a GaN refractive index, $n_m$ is 0.173 which is an Ag refractive index, $k_m$ is 0.95 which is the metal absorption coefficient, and $n_d$ is a refractive index of the dielectric layer which ranges from 0.1 to 4.

Referring to FIG. 3, the lower the refractive index of the dielectric layer is, the higher the reflectivity of the ODR contact becomes. When the refractive index of the dielectric layer is 1, maximum reflectivity is 94%, and when the dielectric layer is SiO2 and the refractive index thereof is 1.5, the reflectivity is 90%. When the refractive index of the dielectric layer is 2.5, that is, is the same as the refractive index of the GaN layer, an Ag layer is formed on the GaN layer and the reflectivity is about 84%. Thus, when the refractive index of the dielectric layer is more than 2.5, improvement of reflectivity of the ODR contact including the dielectric layer disappears and a dielectric layer having a refractive index less than 1 substantially cannot be obtained. Thus, when the refractive index of the dielectric layer of the ODR contact is within the range of 1 to 2.5, this can contribute to improvement of reflectivity.

In addition, the thickness of the dielectric layer is approximately ¼ of the wavelength (nm) of light emitted from the active layer 14, so as to form the ODR contact.

The dielectric layer 52 may be formed of a material selected from the group consisting of silicon oxide, silicon nitride, silicon oxynitride, aluminum oxide, lithium fluoride, calcium fluoride, and magnesium fluoride.

The reflective layer 54 may be formed of a material selected from the group consisting of Ag, Al, Au, Pt, Ru, and Ir.

In addition, the transparent substrate 10 may be formed from a transparent material, for example, sapphire, so that emitted light can transmit through the transparent substrate 10.

Figure 4:
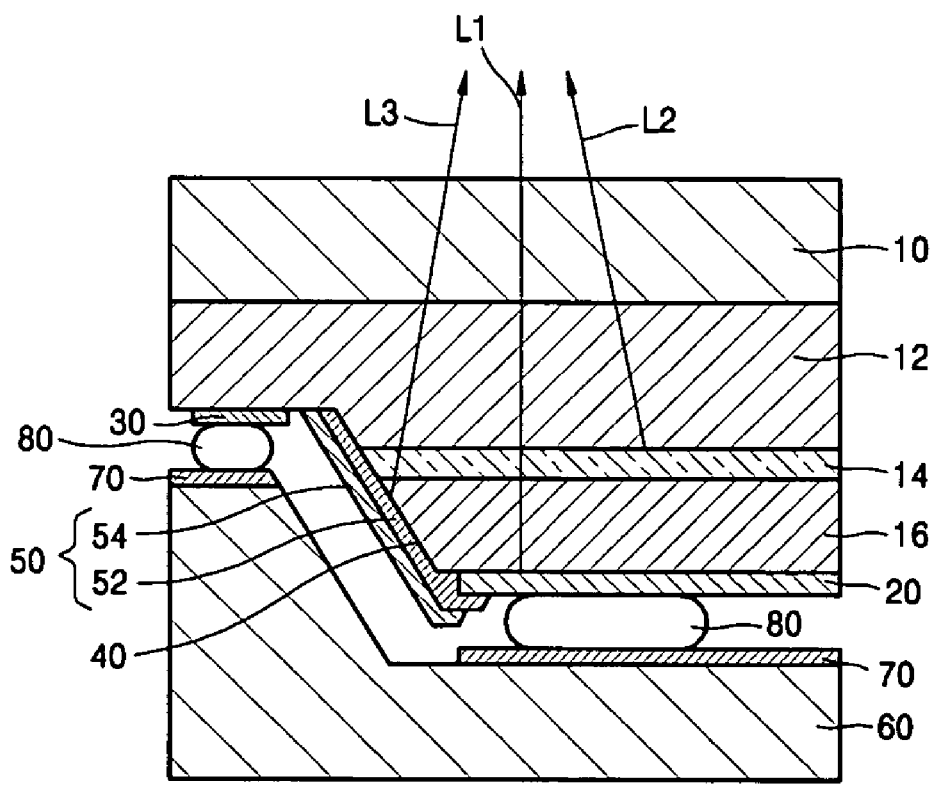
FIG. 4 is a cross-sectional view of a flip-chip light emitting device mounted on a submount, according to the present invention.

FIG. 4 is a cross-sectional view of a flip-chip light emitting device mounted on a submount, according to the present invention. The same reference numerals used in FIG. 4 denote substantially the same elements as those illustrated in FIG. 1, and a detailed description thereof is omitted.

Referring to FIG. 4, a light emitting device according to the present invention is mounted on a submount 60. An electrical interconnection 70 is formed on the submount 60. The electrical interconnection 70 is electrically connected to a p-type electrode 20 and an n-type electrode 30 by a solder ball 80.

When a voltage more than a threshold voltage required for light emission is applied to the p-type electrode 20 and the n-type electrode 30, light is emitted from an active layer 14. A portion L1 of light emitted from the active layer 14 is emitted in a downward direction, reflected from the p-type electrode 20 and proceeds in an upward direction. A portion L2 of light is emitted in an upward direction and passes through a transparent substrate 10. In addition, a portion L3 of light emitted toward a sidewall 40 from the active layer 14 is reflected by a reflective layer 50 and effectively passes through the transparent substrate 10.

As described above, in the semiconductor light emitting device according to the present invention, a highly-reflective layer having an ODR structure is formed on a side surface of a light emitting region, and the light-extracting efficiency is improved. The light-emitting device can be advantageously applied to a light emitting device having a large chip which requires a low power consumption and displays a large optical power.

While the present invention has been particularly shown and described with reference to exemplary embodiments thereof, it will be understood by those skilled in the art that various changes in form and details may be made therein without departing from the spirit and scope of the invention as defined by the following claims.

What is claimed is:

1. A semiconductor light emitting device comprising:
   a substrate;
   an n-type semiconductor layer formed on the substrate;
   an active layer formed on a first region of the n-type semiconductor layer;
   a p-type semiconductor layer formed on the active layer;
   a p-type electrode formed on the p-type semiconductor layer;
   an n-type electrode formed on a second region of the n-type semiconductor layer separated from the first region of the n-type semiconductor layer;
   a single dielectric layer formed on a sidewall of a stack comprising the p-type semiconductor layer, the active layer, and the n-type semiconductor layer; and
   a reflective layer formed on the single dielectric layer,
   wherein a refractive index of the single dielectric layer is 1 to 2.5,
   wherein a thickness of the single dielectric layer is ¼ the wavelength of light emitted from the active layer, wherein the single dielectric layer and the reflective layer constitute an omnidirectional reflective contract having a predetermined degree of reflectivity regardless of a wavelength of light emitted from the active layer and an angle of the light incident on the sidewall of the stack, and wherein the sidewall of the stack is disposed at an angle of approximately 35 to 55 degrees relative to a plane of the substrate.

2. The semiconductor light emitting device of claim 1, wherein the single dielectric layer is formed of a material selected from the group consisting of silicon oxide, silicon nitride, silicon oxynitride, aluminum oxide, lithium fluoride, and calcium fluoride, and magnesium fluoride.

3. The semiconductor light emitting device of claim 1, wherein the substrate is formed of a transparent material.

4. The semiconductor light emitting device of claim 3, wherein the substrate is formed of sapphire.

5. The semiconductor light emitting device of claim 1, wherein the reflective layer is formed of a material selected from the group consisting of Ag, Al, Au, Pt, Ru, and Ir.

6. The semiconductor light emitting device of claim 1, wherein the n-type semiconductor layer, the active layer, and the p-type semiconductor layer are GaN-based group III-V nitride compounds.

7. The semiconductor light emitting device of claim 1, wherein the single dielectric layer is formed on the first region of the n-type semiconductor layer on which the active layer is formed.

8. The semiconductor light emitting device of claim 1, wherein the reflective layer formed on the single dielectric layer is configured to reflect the light emitted from the active layer toward the substrate.

9. The semiconductor light emitting device of claim 1, wherein the p-type electrode formed on the p-type semiconductor layer is configured to reflect light emitted from the active layer toward the substrate.

10. The semiconductor light emitting device of claim 1, wherein the reflective layer is connected to the p-type electrode formed on the p-type semiconductor layer.

11. The semiconductor light emitting device of claim 1, wherein the reflective layer is connected to the n-type electrode formed on the second region of the n-type semiconductor layer.

12. The semiconductor light emitting device of claim 3, wherein the substrate is configured to transmit the light emitted from the active layer and light reflected from the reflective layer therethrough.

13. The semiconductor light emitting device of claim 3, wherein the substrate is configured to transmit the light emitted from the active layer, light reflected for the reflective layer, and light reflected from the p-electrode therethrough.

14. The semiconductor light emitting device of claim 1, wherein the reflectivity of the omnidirectional reflective contact is approximately 84 to 94%.

* * * * *